(12) United States Patent
Kim et al.

(10) Patent No.: US 9,012,595 B2
(45) Date of Patent: *Apr. 21, 2015

(54) POLYIMIDE AND PHOTORESIST RESIN COMPOSITION COMPRISING THEREOF

(75) Inventors: Sang Woo Kim, Daejeon (KR); Chanhyo Park, Daejeon (KR); Kyungjun Kim, Daejeon (KR); Hyeran Seong, Daejeon (KR); Sejin Shin, Daejeon (KR); Hye Won Jeong, Daejeon (KR); Jung Ho Jo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/940,403

(22) Filed: Nov. 5, 2010

(65) Prior Publication Data

US 2011/0111341 A1 May 12, 2011

Related U.S. Application Data

(63) Continuation of application No. PCT/KR2010/004634, filed on Jul. 16, 2010.

(30) Foreign Application Priority Data

Jul. 16, 2009 (KR) .................. 10-2009-0064932

(51) Int. Cl.
| | | |
|---|---|---|
| *C08G 69/26* | (2006.01) | |
| *G03F 7/023* | (2006.01) | |
| *C08G 73/10* | (2006.01) | |
| *C08L 79/08* | (2006.01) | |
| *G03F 7/004* | (2006.01) | |
| *C08L 61/04* | (2006.01) | |

(52) U.S. Cl.
CPC .......... *G03F 7/0233* (2013.01); *C08G 73/1042* (2013.01); *C08L 79/08* (2013.01); *G03F 7/0048* (2013.01); *C08L 61/04* (2013.01); *C08L 2205/02* (2013.01)

(58) Field of Classification Search
CPC ........... C08G 73/1042; C08G 73/1025; C08G 73/1046; G03F 7/0392
USPC ......... 430/191, 192, 270.1; 526/262; 528/353
See application file for complete search history.

(56) References Cited

U.S. PATENT DOCUMENTS

| | | | |
|---|---|---|---|
| 5,288,588 | A | 2/1994 | Yukawa et al. |
| 6,685,997 | B1 | 2/2004 | Murata et al. |
| 2004/0096773 | A1 | 5/2004 | Jung et al. |
| 2006/0199920 | A1* | 9/2006 | Okada et al. .................. 525/426 |
| 2007/0219375 | A1 | 9/2007 | Fujiyama et al. |
| 2009/0111050 | A1* | 4/2009 | Naiini et al. ............... 430/283.1 |
| 2009/0221777 | A1* | 9/2009 | Chiba et al. .................. 526/262 |
| 2012/0270999 | A1 | 10/2012 | Hasegawa |

FOREIGN PATENT DOCUMENTS

| | | |
|---|---|---|
| JP | 2005-173027 A | 6/2005 |
| JP | 2005-250161 A | 9/2005 |
| JP | 2008-083359 A | 4/2008 |
| JP | 2008-231255 A | 10/2008 |
| JP | 2009-009934 A | 1/2009 |
| KR | 1020040040662 A | 5/2004 |
| KR | 1020050038109 A | 4/2005 |
| KR | 100861434 B1 | 10/2008 |
| WO | 2007/052540 A1 | 5/2007 |

OTHER PUBLICATIONS

International Search Report from PCT/KR2010/004634, dated Apr. 19, 2011, 1 page.
Ando et al. "Coloration of Aromatic Polyimides and Electronic Properties of Their Source Materials" Polymer J., vol. 29(1):69-76, 1997.

* cited by examiner

*Primary Examiner* — Gregory Listvoyb
(74) *Attorney, Agent, or Firm* — Rothwell, Figg, Ernst & Manbeck, P.C.

(57) ABSTRACT

The present invention provides polyimide applied to the buffer coating of semiconductors and a photosensitive resin composition including the same. The polyimide is a polyimide polymer represented by Chemical Formula 1 below. Further, the present invention provides a photosensitive resin composition, including 1) BDA-series soluble polyimide having an i-ray permeability of 70% or more; 2) a polyamic acid having elongation of 40% or more; 3) a novolak resin, and 4) diazonaphthoquinone-series photosensitive substance and having a high resolution, high sensitivity, an excellent film characteristic, and mechanical physical properties which are the requirements of semiconductor buffer coating.

11 Claims, 3 Drawing Sheets

POLYIMIDE AND PHOTORESIST RESIN COMPOSITION COMPRISING THEREOF

TECHNICAL FIELD

The present invention relates to a polyimide containing an organic group derived from an acid anhydride of a specific structure within a repetition unit, and a positive-type photosensitive resin composition containing the polyimide as a binder resin. More particularly, the present invention relates to an alkali-soluble photosensitive resin composition containing a polyimide (PI), a polyamic acid (PAA), and a novolak resin and to a photosensitive resin composition having preferred physical properties by regulating the components and a composition ratio of the composition.

BACKGROUND ART

Recently, in the semiconductor device field based on semiconductors and liquid crystal devices, a tendency toward electronic devices having a high degree of integration, a high density, a high reliability, and a high speed is rapidly spreading and an active research is being done utilizing advantages of organic materials that allow for easy processability and higher purity.

A polyimide compound has excellent thermal stability, and excellent mechanical, electrical and chemical characteristics, and thus the use of a photosensitive insulating film as well as a photosensitive resin containing the polyimide compound has expanded not only to the field of semiconductors, but also to the field of displays.

A polyimide polymer is chiefly fabricated using a method comprising (1) obtaining a polyimide precursor solution by performing a 2-step condensation polymerization of a diamine component with a dianhydride component within a polar organic solvent, such as N-methyl-2-pyrrolidone (NMP), dimethylacetamide (DMAc) and dimethylformamide (DMF), (2) coating the polyimide precursor solution on a silicon wafer or glass, and (3) curing the coating through thermal treatment. Polyimide products for commercialized electronic materials are supplied in the form of a polyimide precursor solution or a polyimide film. In the field of semiconductor devices, polyimide products are usually supplied in the form of a polyimide precursor solution.

A polyimide resin is applied to a buffer coating film of a semiconductor device.

A method of assigning photosensitivity to a polyimide resin that can be used in a photosensitive resin composition typically includes a method of chemically combining a crosslinkable function group with a polyimide precursor or a method of mixing a crosslinkable monomer with a polyimide precursor.

For example, there is a method of adding a quinonediazide compound to a polyamic acid, or polyamic acid ester or polyimide which has an acid group in a branched chain. However, although the polyamic acid is excellent in solubility for an alkali developer, it is problematic in reduction in a film upon development. Accordingly, amine, etc. has to be added to the polyamic acid. Further, the polyimide or the polyamic acid ester which has an acid group in a branched chain is excellent in resolution, etc., but problematic in that an absorption factor of a final hardening film is high or an alkali-proof property is deteriorated because the acid group remains in polymers even after the hardening.

DISCLOSURE

The present invention provides a polyimide-series compound made from an acid anhydride of a specific structure and a positive-type photosensitive resin composition containing the polyimide-series compound as a binder resin. In particular, one of the objects of the present invention is to provide a photosensitive resin composition with a high resolution, high sensitivity, excellent film characteristics, and excellent mechanical physical properties by regulating the components of the composition. Such photosensitive resin composition can be used for semiconductor buffer coating.

One embodiment of the present invention provides a polyimide having an i-ray permeability of 70% or more, a weight average molecular weight of 1,000 to 100,000, and a glass transition temperature of 200 to 400° C., wherein the polyimide is represented by Chemical Formula 1 below.

Chemical Formula 1

In the formula, Z is a 4-valence organic group derived from carboxyl dianhydride containing 1 to 100 mol % of butane-1,2,3,4-tetracarboxylic dianhydride, or derivatives thereof;

a repetition unit a is an integer of 1 to 150 and b is an integer of 1 to 400;

Y1 and Y2 are 2-valence organic groups derived from diamine;

Y1 is a 2-valence organic group comprising a phenolic hydroxyl radical, a carboxyl radical, or a hydroxyl radical; and Y2 is a 2-valence aliphatic or aromatic organic group.

Preferably, Y1 of the chemical formula 1 can be one or more groups comprising a 2-valence organic group derived from or a 3,5-diaminobenzoic acid.

Further, the present invention provides a photosensitive resin composition comprising the polyimide. Preferably, 1 to 99 parts by weight of the polyimide, 0 to 60 parts by weight of a polyamic acid, 0 to 50 parts by weight of a novolak resin, and 1 to 50 parts by weight of a photoactive compound can be included for every 100 parts by weight of solid components of the composition. The solid components in the present invention refer to the components of the composition other than a solvent, which include resin of polyimide, novolak resin, photoactive compound and other additives. Preferably, the polyamic acid can have an elongation of 40% or more. The polyamic acid can be represented by Chemical Formula 2 below.

Chemical Formula 2

In the above formula, Z is a 4-valence organic group derived from an acid anhydride or derivatives thereof and it comprises 1 to 100 mol % of at least one group selected from the group consisting of

Y3 is a 2-valence organic group derived from diamine; and a repetition unit c is an integer of 5 to 200.

Preferably, the novolak resin can be obtained by a condensation-reaction of at least one phenol compound selected from the group consisting of 4-t-butylphenol, 4-t-octylphenol, 2-ethylphenol, 3-ethylphenol, 4-ethylphenol, o-cresol, m-cresol, p-cresol, 2,5-xylenol, 3,4-xylenol, 3,5-xylenol, 2,3,5-trimethylphenol, 3-methyl-6-t-butylphenol, 2-naphthol, 1,3-dehydroxynaphthalene and bisphenol-A, with at least one aldehyde compound selected from the group consisting of formaldehyde, paraformaldehyde, acetoaldehyde, benzaldehyde and phenylaldehyde.

Preferably, the photoactive compound (PAC) can be selected from the group consisting of -continued wherein OD is or —OH.

Preferably, 3 to 50 parts by weight of the solid can be included for every 100 parts by weight of the composition.

Preferably, the photosensitive resin composition can further include one or more kinds of a dissolution rate regulator, a sensitizer, an adhesive force enhancer, or a surfactant.

Preferably, 50 to 97 parts by weight of one or more kinds of solvents selected from the group consisting of N,N-dimethylformamide, N,N-dimethylacetamide, N-methylpyrrolidone, N-vinylpyrrolidone, N-methylcaprolactam, dimethylsulfoxide, tetramethyl elements, pyridine, dimethylsulfone, hexamethylsulfoxide, m-cresol, γ-butyrolactone, ethylcellosolve, butylcellosolve, ethylcarbitol, butylcarbitol, ethylcarbitol acetate, butylcarbitol acetate, ethyleneglycol, propylene glycol monomethyl ether acetate (PGMEA), lactic acidethyl, lactic acidbutyl, cyclohezanones and cyclopentanones, can be included for every 100 parts by weight of the composition.

The present invention provides an OLED insulating film and a semiconductor insulating film, each comprising a polyimide film made from the photosensitive resin composition.

The photosensitive resin composition of the present invention is advantageous in that it has a high resolution, high sensitivity, excellent film characteristics, and excellent mechanical physical properties, which are required for semiconductor buffer coating.

MODE FOR INVENTION

The present invention relates to a polyimide, and a positive-type photosensitive resin composition containing the polyimide as a binder resin.

The polyimide has an i-ray permeability of 70% or more, a weight average molecular weight of 1,000 to 100,000, and a glass transition temperature of 200 to 400° C. The polyimide is represented by Chemical Formula 1 below. More particularly, the polyimide can be made by reacting butane-1,2,3,4-tetracarboxylic dianhydride (hereinafter referred to as "BDA") or derivatives thereof with diamine.

Chemical Formula 1

In the above formula, Z is a 4-valence organic group derived from a carboxyl dianhydride containing 1 to 100 mol % of the BDA, or derivatives thereof;

a repetition unit a is an integer of 1 to 150 and b is an integer of 1 to 400;

Y1 and Y2 are 2-valence organic groups derived from diamine;

Y1 is a 2-valence organic group derived from or a 3,5-diaminobenzoic acid, or a 2-valence organic group containing a phenolic hydroxyl radical, a carboxyl radical, or a hydroxyl radical; and Y2 is a 2-valence aliphatic or aromatic organic group.

Meanwhile, it is preferred that Y1 and Y2 do not contain side chains to obtain a high resolution and improved film physical properties. More particularly, if the side chains are included, additional functions can be obtained through the side chains, but thermal stability, a glass transition temperature Tg, and mechanical physical properties of polymer can be deteriorated. High thermal stability and mechanical physical properties are the basic requirements of polyimide to be used as electronic materials. In order to prevent the deterioration of the physical properties, it is preferred that Y1 and Y2 do not include the side chains.

Further, the present invention provides a photosensitive resin composition, containing 1) the above polyimide; 2) a polyamic acid; 3) a novolak resin, and 4) a photoactive compound.

Each of the components of the photosensitive resin composition is described in detail below.

1) Polyimide

As described above, the polyimide is represented by Chemical Formula 1 below.

Chemical Formula 1

In the above formula, Z is a 4-valence organic group derived from a carboxyl dianhydride containing 1 to 100 mol % of BDA, or derivatives thereof;

a repetition unit a is an integer of 1 to 150 and b is an integer of 1 to 400;

Y1 and Y2 are 2-valence organic groups derived from diamine;

Y1 is a 2-valence organic group derived from or a 3,5-diaminobenzoic acid, or a 2-valence organic group containing a phenolic hydroxyl radical, a carboxyl radical, or a hydroxyl radical; and Y2 is a 2-valence aliphatic or aromatic organic group.

More particularly, the polyimide represented by Chemical Formula 1 can be fabricated by reacting carboxyl dianhydride (hereinafter referred to as 'acid anhydride') containing the BDA, or derivatives thereof, with organic diamine containing the 2-valence organic group Y1 or Y2.

The BDA imparts a high a transmission characteristic to the polyimide so that the photosensitive resin composition can achieve a high resolution and sensitivity. Accordingly, in the present invention, the polyimide made from the acid anhydride containing the BDA of 1 to 100 mol %, can be used as one of the components of the photosensitive resin composition.

Meanwhile, in Chemical Formula 1, the acid anhydride or derivatives thereof from which the substituent Z is derived can be, one or more kinds of acid anhydride selected from the group comprising an dianhydride pyromellitic acid, 3,3',4,4'-biphenyltetracarboxylic dianhydride, 3,3',4,4'-benzophenonetetracarboxylic dianhydride, 3,3',4,4'-diphenylethertetracarboxylic dianhydride, 3,3',4,4'-diphenylsulfonetetracarboxylic dianhydride, 2,2-bis(3,4-dicarboxyphenyl)hexafluoroisoproylidene dianhydride, 3,3',4,4'-biphenyltetracarboxylic dianhydride, 4,4'-hexafluoroisopropylidenediphthalic dianhydride, 3,3',4,4'-diphenylsulfonetetracarboxylic dianhydride, 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]octo-7-N-2,3,5,6-tetracarboxylic dianhydride, 2,3,4,5-tetrahydrofurantetracarboxylic dianhydride, 3,5,6-tricarboxy-2-norbornane acetic dianhydride, and the BDA, or derivatives thereof. However, the present invention is not limited thereto.

Further, in Chemical Formula 1, the substituent Y1 is a 2-valence organic group containing a phenolic hydroxyl radical, a carboxyl radical, or a hydroxyl radical. The polyimide of the present invention should have a proper solubility for an alkali developer so that the polyimide can be used as a binder resin in the photosensitive resin composition. To this end, in polyimide polymerization, diamine containing a phenolic hydroxyl radical, a carboxyl radical, or a hydroxyl radical is used, and the substituent Y1 is defined as a 2-valence organic group derived from the diamine. As a detailed example, the substituent Y1 can be at least one 2-valence organic group derived from a group selected from the consisting of and a 3,5-diaminobenzoic acid. However, the present invention is not limited thereto. For example, any diamine can be used as long as it can provide a 2-valence organic group containing a phenolic hydroxyl radical, a carboxyl radical, or a hydroxyl radical.

Further, in Chemical Formula 1, the substituent Y2 is derived from diamine that is used to fabricate common polyimide polymers. The diamine can include, for example, one or more kinds of aromatic diamines selected from the group consisting of p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; and one or more kinds of aliphatic diamine selected from the group consisting of 1,6-hexenediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, and 4,4'-diamino-3,3'-dimethyldicyclohexylmethane. The aromatic diamine and the aliphatic diamine can be used together. However, the present invention is not limited thereto.

The polyimide of the present invention is obtained by reacting the acid anhydride with the diamine, polymerizing them to produce a polyimide precursor, and then performing dehydration and ring-closing. A temperature when the acid anhydride and the diamine are reacted with each other can range from 80 to 240° C., preferably, 130 to 200° C.

Further, N,N-dimethylformamide, N,N-dimethylacetamide, N-methylpyrrolidone, N-vinylpyrrolidone, N-methylcaprolactam, dimethylsulfoxide, tetramethyl elements, pyridine, dimethylsulfone, hexamethylsulfoxide, m-cresol, γ-butyrolactone, or propylene glycol monomethyl ether acetate (PGMEA) can be used either solely or in combination as a polar solvent for the reaction of the diamine and the acid anhydride.

A polyamic acid which is a precursor of the above polyimide is precipitated into a solvent such as methanol or ethanol, separated, recovered, and then used.

It is preferred that the polyimide represented by Chemical Formula 1 has a weight average molecular weight of 1,000 to 100,000. Further, it is preferred that the polyimide has a glass transition temperature of 200 to 400° C. If the weight average molecular weight is too low (e.g., less than 1,000), sufficient mechanical and thermal stabilities may not be obtained. If the weight average molecular weight is too high (e.g., more than 100,000), thin film coating, a high resolution, and high sensitivity may difficult to be implemented. Furthermore, if the glass transition temperature is too low (e.g., less than 200° C.), thermal stability is low, making it difficult to guarantee reliability in a subsequent high-temperature and high-pressure processing process. If the glass transition temperature is too high (e.g., more than 400° C.), the development property can be deteriorated.

Further, the polyimide represented by Chemical Formula 1 has transmissivity of 70% or more in the i-ray wavelength, high sensitivity, and a high resolution.

It is preferred that 1 to 99 parts by weight of the polyimide is included for every 100 parts by weight of solid components of the photosensitive resin composition according to the present invention.

2) Polyamic Acid

The polyamic acid which is a second component of the photosensitive resin composition according to the present invention can be represented by Chemical Formula 2 below.

Chemical Formula 2

In the above formula, Z is a 4-valence organic group derived from acid anhydride or derivatives thereof, and it contains 1 to 100 mol % of a group selected from the group consisting of:

Y3 is a 2-valence organic group derived from diamine; and a repetition unit c is an integer of 5 to 200.

The substituent Z is derived from acid anhydrides or derivatives thereof and can be derived from one or more kinds of acid anhydrides selected from the group consisting of an dianhydride pyromellitic acid, 3,3',4,4'-biphenyltetracarboxylic dianhydride, 3,3',4,4'-benzophenonetetracarboxylic dianhydride, 3,3',4,4'-diphenylethertetracarboxylic dianhydride, 3,3',4,4'-diphenylsulfonetetracarboxylic dianhydride, 2,2-bis(3,4-dicarboxyphenyl)hexafluoroisopropylidene dianhydride, 3,3',4,4'-biphenyltetracarboxylic dianhydride, 3,3',4,4'-benzophenonetetracarboxyl dianhydride, 4,4'-hexafluoroisopropylidenediphthalic dianhydride, 3,3',4,4'-diphenylsulfonetetracarboxylic dianhydride, 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxyl dianhydride, 2,3,5-tricarboxy-2-cyclopentane acetic dianhydride, bicyclo[2.2.2]octo-7-N-2,3,5,6-tetracarboxylic dianhydride, 2,3,4,5-tetrahydrofurantetracarboxylic dianhydride, 3,5,6-tricarboxy-2-norbornane acetic dianhydride, and aliphatic tetracarboxylic dianhydride, such as 1,2,3,4-butanetetracarboxylic dianhydride, or derivatives thereof.

Detailed examples of the diamine from which the substituent Y3 is derived can include one or more kinds of aromatic diamines selected from the group consisting of p-phenylenediamine, m-phenylenediamine, 2,4,6-trimethyl-1,3-phenylenediamine, 2,3,5,6-tetramethyl-1,4-phenylenediamine, 4,4'-diaminodiphenylether, 3,4'-diaminodiphenylether, 3,3'-diaminodiphenylether, 4,4'-diaminodiphenylsulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4 aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; and one or more kinds of aliphatic diamine selected from the group comprising 1,6-hexenediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, and 4,4'-diamino-3,3'-dimethyldicyclohexylmethane. The aromatic diamine and the aliphatic diamine can be used in combination.

The polyamic acid represented by Chemical Formula 2 can be obtained by reacting the acid anhydride from which the substituent Z is derived, with the diamine from which the substituent Y3 is derived.

In order to obtain the polyamic acid from the acid anhydride and the diamine, the acid anhydride and the diamine are reacted with each other in a polar solvent using N,N-dimethylformamide, N,N-dimethylacetamide, N-methylpyrrolidone, N-vinylpyrrolidone, N-methylcaprolactam, dimethylsulfoxide, tetramethyl elements, pyridine, dimethylsulfone, hexamethylsulfoxide, m-cresol, and γ-butyrolactone either solely or in combination at a reaction temperature of −20 to 150° C., preferably, −5 to 100° C.

It is preferred that the repetition unit c of the polyamic acid represented by Chemical Formula 2 is an integer of 5 to 200.

It is preferred that the polyamic acid represented by Chemical Formula 2 have an elongation of 40% or more. The deformation and/or breakage of semiconductor devices, which are usually caused by thermal or mechanical stress applied when the semiconductor devices are fabricated, can be reduced, and the reliability of the semiconductor devices can be improved.

It is preferred that 0 to 60 parts by weight of the polyamic acid be included for every 100 parts by weight of solid components (portions other than solvents) of the photosensitive resin composition according to the present invention.

Meanwhile, the polyimide or the polyamic acid can include a reaction sealing group at its one or both terminals irrespective of the type of the reaction sealing group. The reaction sealing group is introduced by inputting a monomer having a reactive functional group (e.g., a monoamine compound or a monoanhydride compound having a carbon-carbon double bond) in a process of fabricating the polyimide or the polyamic acid. If the monomer having the reactive functional group is inputted, the molecular weight of the polyimide or the polyamic acid can be controlled within a desired range and the viscosity of a final resin composition can be lowered. Further, the physical properties of a film can be greatly improved because a crosslink is formed between the terminal sealing groups in a curing process performed after a pattern process, and the molecular weight of the film can be sharply increased. In the present invention, 1 to 50 mol % of the monomer having the reactive functional group can be used in the entire amount of the acid anhydride or the diamine.

3) Novolak Resin

The novolak resin (i.e., a third component of the photosensitive resin composition of the present invention) is used to control the resolution and sensitivity of the photosensitive resin composition.

The novolak resin of the present invention has an alkali-soluble group, and it is obtained through a condensation reaction of phenol and aldehyde. The phenols can include phenol, 4-t-butylphenol, 4-t-octylphenol, 2-ethylphenol, 3-ethylphenol, 4-ethylphenol, o-cresol, m-cresol, p-cresol, 2,5-xylenol, 3,4-xylenol, 3,5-xylenol, 2,3,5-trimethylphenol, 3-methyl-6-t-butylphenol, 2-naphthol, 1,3-dehydroxynaphthalene, or bisphenol-A. The aldehydes can include formaldehyde, paraformaldehyde, acetoaldehyde, benzaldehyde, or phenylaldehyde. The phenols and the aldehydes can be used solely or two or more kinds of them can be used in combinations. An organic acid such as an oxalic acid, a p-toluenesulfonic acid, or a trichloroacetic acid, an inorganic acid such as an sulphuric acid, a hydrochloric acid, or a phosphoric acid, or metallic salts such as zinc chloride, aluminum chloride, magnesium acetate, or zinc acetate can be used as a catalyst in the condensation reaction. It is preferred that the novolak resin used in the photosensitive resin composition of the present invention have a weight average molecular weight of 2,500 to 15,000 when it is converted into polystyrene. If the molecular weight is less than 2,500, there is a danger of excessive development. If the molecular weight is more than 15,000, the coating characteristic is not guaranteed and there is a danger of non-development.

It is preferred that 0 to 50 parts by weight of the novolak resin be included for every 100 parts by weight of the solid components (portions other than solvents) of the photosensitive resin composition.

4) Photoactive Compound

The photoactive compound (i.e., a fourth component of the photosensitive resin composition of the present invention) generates an acid when being radiated with light. Any compound can be used so long as it generates an acid through photolysis and increases the solubility of a light radiation unit for an alkali developer. A single compound can be used or two or more kinds of compounds can be used in combination.

As a detailed example, an o-quinonediazide compound, allyl diazonium salts, diallyl iodonium salts, triallyl sulfonium salts, o-nitro benzylester, p-nitro benzylester, trihalomethyl group methatheses-triazine derivatives, imidesulphonate derivatives, or the like can be used as the photoactive compound.

Of the compounds, it is preferred that the o-quinonediazide compound be used to obtain the sensitivity or resolution.

Typically, the o-quinonediazide compound is used as o-quinonediazidesulfonic ester or o-quinonediazidesulfoneamide, which is obtained by a condensation-reaction of a compound having o-quinonediazide sulfonyl chloride and a hydroxyl radical with a compound having an amino group in the presence of a basic catalyst.

In particular, it is preferred that the o-quinonediazide compound be selected from the group consisting of:

-continued wherein OD is or —OH.

It is preferred that 1 to 50 parts by weight of the photoactive compound be included for every 100 parts by weight of the solid components (portions other than solvents) of the photosensitive resin composition according to the present invention.

It is preferred that 3 to 50 parts by weight of the solid components be included for every 100 parts by weight of the composition. If the solid components are included less than 3 parts by weight, there are problems in that adhesiveness with a substrate is reduced and a uniform coating characteristic and a desired film thickness are difficult to obtain. If the solid components are included more than 50 parts by weight, a smooth surface when coating is performed cannot be obtained because the viscosity is excessively increased and a uniform mixing is made difficult when dispensation is performed because a desired thickness cannot be obtained. Consequently, it may be difficult to obtain physical properties for forming fine patterns.

Meanwhile, any type of solvent can be used in the photosensitive resin composition of the present invention so long as it can dissolve polymer compounds such as polyimide, a polyamic acid, and a novolak resin. As a detailed example, the solvent can include one or more kinds selected from the group comprising N,N-dimethylformamide, N,N-dimethylacetamide, N-methylpyrrolidone, N-vinylpyrrolidone, N-methylcaprolactam, dimethylsulfoxide, tetramethyl elements, pyridine, dimethylsulfone, hexamethylsulfoxide, m-cresol, γ-butyrolactone, ethylcellosolve, butylcellosolve, ethylcarbitol, butylcarbitol, ethylcarbitol acetate, butylcarbitol acetate, ethyleneglycol, propylene glycol monomethyl ether acetate (PGMEA), lactic acidethyl, lactic acidbutyl, cyclohezanones, and cyclopentanones.

The photosensitive resin composition of the present invention can further include other additives, such as a dissolution rate regulator, a sensitizer, an adhesive force enhancer, and a surfactant, in addition to the above-described components.

The positive-type photosensitive resin composition of the present invention having the above-described composition, is coated on a glass substrate using a common method such as spin coating, slit spin coating, roll coating, die coating, or curtain coating, and then is subjected to exposure and development processes, thereby forming a photosensitive film. In the exposure and development processes, a method of forming a photosensitive film using a common photosensitive resin composition can be used, but the present invention is not limited thereto.

In the exposure process, a light source radiated by illumination means is not specially limited and can be appropriately selected. The light source can include, for example, electronic waves, a visible ray from ultraviolet rays, an electron ray, X-rays, and a laser beam. Furthermore, a method of radiating light using the illumination means is not specially limited and can be appropriately selected. For example, a method of radiating light using a known light source, such as a high pressure mercury lamp, a xenon lamp, a carbon arc lamp, a halogen lamp, a cold cathode-ray tube for a duplicator, an LED, or a semiconductor laser, can be used.

The development process is carried out to form a pattern by removing areas, exposed through an exposure process, using a developer. The developer is not specially limited and can be appropriately selected. The developer can include, for example, hydroxides or carbonates of alkali metal or alkali earth metal, hydrogen carbonates, ammonia in aqueous solution, and NH4+ salts in aqueous solution. In particular, a TMAH (Tetramethylammonium hydroxide) aqueous solution preferably can be used as the developer.

The developer, together with a surfactant, an anti-foaming agent, an organic base (e.g., benzylamine, ethylenediamine, ethanolamine, tetramethylammonium hydroxide, diethylenetriamine, triethylenepentamine, morpholine, and triethanolamine), or an organic solvent (e.g., alcohols, ketones, esters, ethers, amides, and lactones), can be used in order to accelerate development. Further, the developer can be a water-based developer in which water or an alkali aqueous solution and an organic solvent are mixed or can be a single organic solvent.

In the entire process, the photosensitive resin composition of the present invention is spin-coated on a glass and pre-baked at a temperature of about 100° C. for 2 minutes, thereby forming a film. The film is exposed to energy of 100 to 200 mJ/cm$^2$ generated from a high-pressure mercury lamp through a photomask. The obtained pattern is developed using a TMAH aqueous solution, washed using deionized water, and then post-baked in a temperature range of 200 to 350° C. for about 30 to 60 minutes, thereby obtaining a desired pattern.

The above photosensitive film can have a different thickness, if appropriate, but preferably 1 to 20 μm. However, the present invention is not limited thereto.

The photosensitive resin composition of the present invention has a positive-type photosensitive characteristic having a high sensitivity and a high resolution. Further, if the photosensitive resin composition of the present invention is used, etching using an alkali aqueous solution is facilitated, and a photosensitive film, including a relief pattern having a fine shape and high measurement precision, can be easily formed using a mask having a specific pattern.

The positive-type photosensitive resin composition of the present invention preferably is used in not only the interlayer insulating film, the passivation film, and the buffer coating film of a semiconductor device, an insulating film for a multi-print substrate, and the insulating film of an OLED display, but also the protection film of a thin film transistor of a liquid crystal display, the electrode protection film of an organic EL device, and a semiconductor protection film.

Embodiments of the present invention are described in more detail below, but the present invention is not limited thereto.

Synthesis Example 1

Fabricate the Polyimide Represented by Chemical Formula 2,2-bis(3-amino-4-hydroxyphenyl)hexafluoropropane of 11.0 g and γ-butyrolactone of 40 g were sequentially put in a 100 mL-round bottom flask, slowly agitated, and fully dissolved. In the state in which the flask was warmed up in a double boiler and maintained at room temperature, butane-1,2,3,4-tetracarboxylic dianhydride of 5.9 g was slowly added to the solution. The mixture was agitated at room temperature for 16 hours, and toluene of 7 g was put in the mixture. After a dean-stark distillation apparatus was installed in order to remove water, the mixture was refluxed at a temperature of 140° C. for 3 hours. Next, the solution was cooled at room temperature, slowly poured into a mixture of methanol: water=1:4, and then solidified. Next, the solution was dried in the vacuum dry oven of 40° C. for one day, thereby obtaining polyimide resin of 14 g.

A polyimide creation peak was checked through IR. It was also checked that a weight average molecular weight and a poly disperse index (PDI) of the polyimide resin measured through GPC were 40,000 and 1.5.

Synthesis Example 2

Fabricate the Polyamic Acid Represented by Chemical Formula 2

4,4'-oxydianiline of 73.3 g, and γ-butyrolactone of 300 g were sequentially put in a 1 L-round bottom jacketed process vessel, slowly agitated, and fully dissolved. In the state in which a jacketed temperature of the process vessel was maintained at 20° C., 3,3',4,4'-diphenylsulfonetetracarboxylic dianhydride of 55.8 g was slowly added to the solution and then agitated. Next, the mixture was agitated for 2 hours, sufficiently reacted, and additionally agitated at room temperature for 16 hours, thereby producing the polyamic acid.

A polyamic acid creation peak was checked through IR. It was also checked that a weight average molecular weight and a poly disperse index (PDI) of the polyimide resin measured through GPC were 50,000 and 1.6.

Embodiment 1: Example of Fabricating Photosensitive Resin Composition (Polyimide Composition)

A diazonaphthoquinone ester compound (TPPA 320: OH or OD was selectively used according to the ratio of OD/(OD+OH)=2/3) of 0.5 g (i.e., a photoactive compound) and γ-butyrolactone (GBL) of 4 g (i.e., a solvent) were added to soluble polyimide of 1.6 g synthesized in the synthesis example 1 and then agitated at room temperature for 1 hour. The mixture was filtered using a filter having a pore size of 1 μm, thereby fabricating the photosensitive resin composition.

Embodiment 2: Example of Fabricating Photosensitive Resin Composition (Polyimide/Polyamic Acid Blending)

Soluble polyimide of 8.2 g synthesized in the synthesis example 1 and a polyamic acid of 27.5 g synthesized in the synthesis example 2 were mixed to produce a mixture. A diazonaphthoquinone ester compound (TPPA 320: OH or OD was selectively used according to the ratio of OD/(OD+OH)=2/3) of 4.7 g (i.e., a photoactive compound) and γ-butyrolactone (GBL) of 18 g (i.e., a solvent) were added to the mixture and then agitated at room temperature for 1 hour. Next, the mixture was filtered using a filter having a pore size of 1 μm, thereby fabricating the photosensitive resin composition.

Embodiment 3: Example of Fabricating Photosensitive Resin Composition (Polyimide/Novolak Blending)

Soluble polyimide of 2 g synthesized in the synthesis example 1 was mixed with novolak of 0.5 g having m-Cresol:p-Cresol=6:4 and a molecular weight of 6,000. A diazonaphthoquinone ester compound (TPPA 320: OH or OD was selectively used according to the ratio of OD/(OD+OH)=2/3) of 0.5 g (i.e., a photoactive compound) and γ-butyrolactone (GBL) of 5.5 g (i.e., a solvent) were added to the mixture and then agitated at room temperature for 1 hour. Next, the mixture was filtered using a filter having a pore size of 1 μm, thereby fabricating the photosensitive resin composition.

Embodiment 4: Example of Fabricating Photosensitive Resin Composition (Polyimide/Polyamic Acid/Novolak Blending)

Soluble polyimide of 4 g synthesized in the synthesis example 1 was mixed with a polyamic acid of 4.3 g synthesized in the synthesis example 2, thereby producing a mixture. Novolak of 1.4 g having m-Cresol:p-Cresol=6:4 and a molecular weight of 6,000 was added to the mixture. Next, a diazonaphthoquinone ester compound (TPPA 320: OH or OD was selectively used according to the ratio of OD/(OD+OH)=2/3) of 0.7 g (i.e., a photoactive compound) and γ-butyrolactone (GBL) of 13.7 g (i.e., a solvent) were added to the mixture and then agitated at room temperature for 1 hour. Next, the mixture was filtered using a filter having a pore size of 1 μm, thereby fabricating the photosensitive resin composition.

Comparison Synthesis Example 1

2,2-bis(3-amino-4-hydroxyphenyl)hexafluoropropane of 11.0 g and γ-butyrolactone of 40 g were sequentially put in a 100 mL-round bottom flask, slowly agitated, and then fully dissolved. In the state in which the flask was warmed up in a double boiler and maintained at room temperature, 3,4',4,4'-benzophenone tetracarboxylic dianhydride of 9.7 g was slowly added to the solution. The mixture was agitated at room temperature for 16 hours, and toluene of 7 g was put in the mixture. After a dean-stark distillation apparatus was installed in order to remove water, the mixture was refluxed at a temperature of 140° C. for 3 hours. The solution was cooled at room temperature, slowly poured into a mixture of methanol: water=1:4, and then solidified. Next, the solution was dried in the vacuum dry oven of 40° C. for one day, thereby obtaining a soluble polyimide resin of 16 g.

A polyimide creation peak was checked through IR. It was also checked that a weight average molecular weight and a poly disperse index (PDI) of the polyimide resin measured through GPC were 40,000 and 1.5.

Comparison Synthesis Example 2

1,1-bis[4-(4-aminophenyl)methylphenyl]-4-n-butylcyclohexene of 6 g, 1,1-bis(4-aminophenoxy)phenyl-4-(4-pentylcyclohexyl)cyclohexene of 5 g, and γ-butyrolactone of 40 g were sequentially put in a 100 mL-round bottom flask, slowly agitated, and then fully dissolved. In the state in which the flask was warmed up in a double boiler and maintained at room temperature, cyclobutane tetracarboxylic dianhydride of 9.7 g was slowly added to the solution. The mixture was agitated at room temperature for 16 hours, and toluene of 7 g was put in the mixture. After a dean-stark distillation apparatus was installed in order to remove water, the mixture was refluxed at a temperature of 140° C. for 3 hours. The solution was cooled at room temperature, slowly poured into a mixture of methanol: water=1:4, and then solidified. Next, the solution was dried in the vacuum dry oven of 40° C. for one day, thereby obtaining a soluble polyimide resin of 16 g having side chains.

A polyimide creation peak was checked through IR. It was also checked that a weight average molecular weight and a poly disperse index (PDI) of the polyimide resin measured through GPC were 40,000 and 1.5.

Comparison Example 1

Example of Fabricating Photosensitive Resin Composition (Polyimide Composition)

A diazonaphthoquinone ester compound (TPPA 320: OH or OD was selectively used according to the ratio of OD/(OD+OH)=2/3) of 0.5 g (i.e., a photoactive compound) and γ-butyrolactone (GBL) of 4 g (i.e., a solvent) were added to soluble polyimide of 1.6 g synthesized in the comparison synthesis example 1 and then agitated at room temperature for 1 hour. The mixture was filtered using a filter having a pore size of 1 μm, thereby fabricating the photosensitive resin composition.

Comparison Example 2

Example of Fabricating Photosensitive Resin Composition (Polyimide Composition)

A diazonaphthoquinone ester compound (TPPA 320: OH or OD was selectively used according to the ratio of OD/(OD+OH)=2/3) of 0.5 g (i.e., a photoactive compound) and γ-butyrolactone (GBL) of 4 g (i.e., a solvent) were added to soluble polyimide of 1.6 g synthesized in the comparison synthesis example 2 and then agitated at room temperature for 1 hour. The mixture was filtered using a filter having a pore size of 1 μm, thereby fabricating the photosensitive resin composition.

Experiment Examples

1. Evaluation of Resolution

The photosensitive resin compositions fabricated according to the embodiments and the comparison examples were spin-coated on respective 4-inch silicon wafers and then heated on a hot plate at a temperature of 120° C. for 2 minutes, thereby producing respective photosensitive films of 15 μm in thickness. After the silicon wafers on which pre-baking processing was performed were closely adhered to photomasks, the wafers were sequentially exposed to energy of 20 mJ/cm$^2$ to 600 mJ/cm$^2$ at intervals of 5 mJ/cm$^2$ using G-line stepper Nikon NSR 1505 G4. After the wafers were developed in TMAH (tetramethyl ammonium hydroxide) aqueous solution of 2.38 wt % at a temperature of 23° C. for 80 seconds, washed using ultrapure water for 60 seconds, and then dried, thereby obtaining respective patterns having sharp non-exposed portions. The patterned silicon wafers were slowly heated on the hot plate from room temperature to about 180° C. in the nitrogen air current for 30 minutes, maintained at a temperature of 180° C. for 60 minutes, slowly heated up to 300° C. for 30 minutes, and then subjected to thermal treatment at a temperature of 300° C. for 60 minutes.

The films made from the compositions of the embodiments 1 and 2 had a thickness of 10 μm and showed an excellent resolution having a minimum line width of 3 μm. Meanwhile, the film made from the composition of the comparison example 1 had a minimum line width of 20 μm and showed a lower resolution than the film made from the composition of the present invention. Further, the film made from the composition of the comparison example 2 also had a low resolution as compared with the embodiments.

Figure 1:
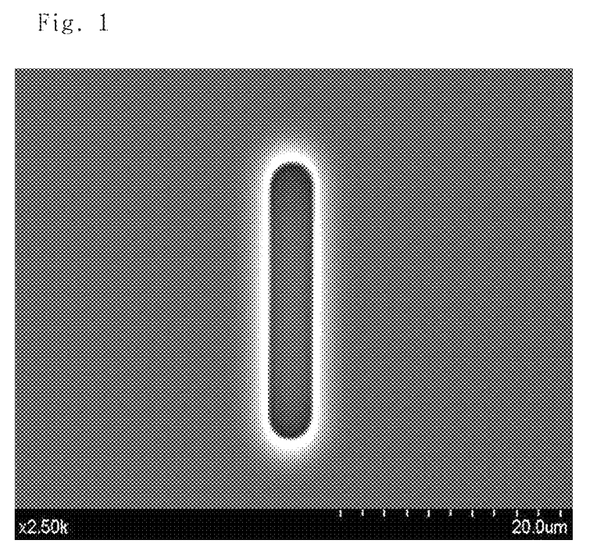
FIGS. 1 to 3 are electron microscope photographs showing patterns made from the compositions according to embodiments 1 and 2 and a comparison embodiment 1, respectively.

FIG. 1 is an electron microscope photograph showing a pattern made from the photosensitive resin composition of the embodiment 1. From FIG. 1, it can be seen that there is formed a 3 μm-hole pattern.

Figure 2:
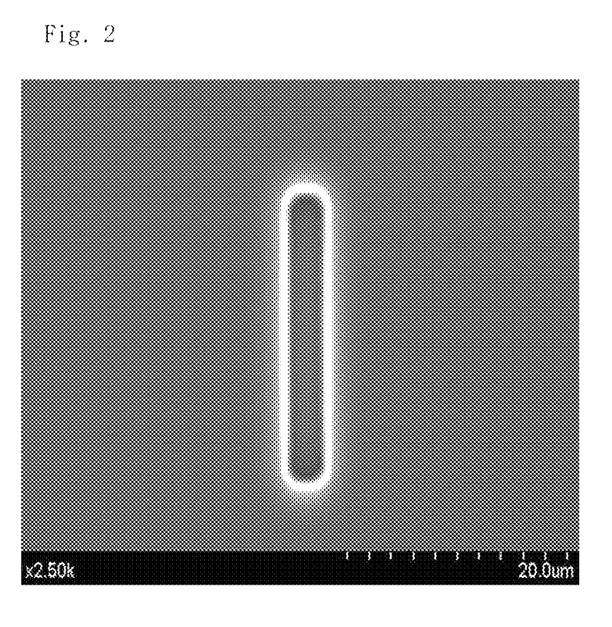

FIG. 2 is an electron microscope photograph showing a pattern made from the photosensitive resin composition of the embodiment 2. From FIG. 2, it can be seen that there is formed a 3 μm-hole pattern when a polyamic acid is blended.

Figure 3:
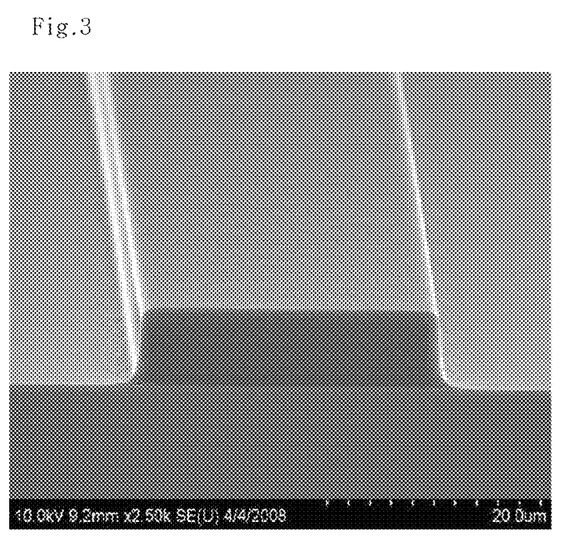

FIG. 3 is an electron microscope photograph showing a pattern made from the photosensitive resin composition of the comparison example 1. From FIG. 3, it can be seen that a hole pattern is not fully perforated and a 20 μm-line pattern is formed.

2. Evaluation of Film Physical Properties

The photosensitive resin compositions fabricated according to the embodiments and the comparison examples were spin-coated on respective glass substrates and thermally treated on a hot plate sequentially at a temperature of 180° C. for 60 minutes and 300° C. for 60 minutes in the nitrogen air current, thereby forming respective films of 10 μm in thickness. Next, the films were subjected to a pressure cooking treatment (PCT) process in an autoclave under the conditions of 125° C. and 2.3 atm for 30 minutes and then peeled off from the glass substrates. Each of the peeled films was cut into samples of 1 cm in width and 8 cm in length. Tensile characteristics for the samples were measured, and the measurement results are listed in Table 1 below.

TABLE 1

| | Tensile strength (MPa) | Elongation (%) | Modulus (Gpa) |
|---|---|---|---|
| Embodiment 1 | 110.5 | 15.8 | 3.1 |
| Embodiment 2 | 130.5 | 32.8 | 3.3 |

TABLE 1-continued

| | Tensile strength (MPa) | Elongation (%) | Modulus (Gpa) |
|---|---|---|---|
| Embodiment 3 | 112.3 | 14.2 | 3.2 |
| Embodiment 4 | 135.3 | 34.5 | 3.2 |
| Comparison example 1 | 98.2 | 5.3 | 2.8 |
| Comparison example 2 | 96.3 | 13.8 | 2.1 |

From Table 1, it can be seen that the embodiment 1 using the polyimide of the present invention as a binder resin within a photosensitive resin composition is much excellent in mechanical physical properties, including tensile strength, as compared with the comparison examples. It can also be seen that the embodiments 2 and 4 using the polyamic acid or the polyamic acid and the novolak resin, blended with polyimide, as a binder resin can form patterns having much improved mechanical physical properties.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A positive-type photosensitive resin composition comprising
   (i) a polyimide having an i-ray permeability of 70% or more, a weight average molecular weight of 1,000 to 100,000, and a glass transition temperature of 200° C. to 400° C., represented by Chemical Formula 1

Chemical Formula 1 wherein
   $Z_1$ is a 4-valence organic group derived from carboxyl dianhydride containing 1 to 100 mol % of butane-1,2,3, 4-tetracarboxylic dianhydride or derivatives of butane-1,2,3,4-tetracarboxylic dianhydride;
   a is an integer of 1 to 150;
   b is an integer of 1 to 400;
   $Y_1$ and $Y_2$ are 2-valence organic groups derived from diamine;
   $Y_1$ is a 2-valence organic group derived from a group selected from the group consisting of and a 3,5-diaminobenzoic acid;
$Y_2$ is a 2-valence aliphatic or aromatic organic group, with the proviso that the group is not a phenolic hydroxyl radical, a carboxyl radical or a hydroxyl radical;

(ii) a photoactive compound, and

(iii) a polyamic acid having an elongation of 40% or more and is represented by Chemical Formula 2

Chemical Formula 2 wherein $Z_2$ is a 4-valence organic group derived from an acid anhydride or derivatives of the acid anhydride and comprises 1 to 100 mol % of at least one group selected from the group consisting of $Y_3$ is a 2-valence organic group derived from diamine; and c is an integer of 5 to 200.

2. The positive-type photosensitive resin composition of claim 1, wherein the polyimide is present 1 to 99 parts by weight for every 100 parts by weight of solid of the composition.

3. The positive-type photosensitive resin composition of claim 2, further comprising 0 to 50 parts by weight of a novolak resin, and 1 to 50 parts by weight of a photoactive compound for every 100 parts by weight of solid of the composition.

4. The positive-type photosensitive resin composition of claim 1, comprising 0 to 60 parts by weight of the polyamic acid for every 100 parts by weight of solid of the composition.

5. The positive-type photosensitive resin composition of claim 3, wherein the novolak resin is obtained by a condensation-reaction of a phenol compound and an aldehyde compound; and wherein the phenol compound is at least one selected from the group consisting of 4-t-butylphenol, 4-t-octylphenol, 2-ethylphenol, 3-ethylphenol, 4-ethylphenol, o-cresol, m-cresol, p-cresol, 2,5-xylenol, 3,4-xylenol, 3,5-xylenol, 2,3,5-trimethylphenol, 3-methyl-6-t-butylphenol, 2-naphthol, 1,3-dehydroxynaphthalene, and bisphenol-A, and the aldehyde compound is at least one selected from the group consisting of formaldehyde, paraformaldehyde, acetoaldehyde, benzaldehyde, and phenylaldehyde.

6. The photosensitive resin composition of claim 1, wherein the photoactive compound is selected from the group consisting of

-continued

, and wherein OD is

7. The positive-type photosensitive resin composition of claim 3, wherein 3 to 50 parts by weight of the solid is present in every 100 parts by weight of the composition.

8. The positive-type photosensitive resin composition of claim 3, further comprising at least one of a dissolution rate regulator, a sensitizer, an adhesive force enhancer, and a surfactant.

9. The positive-type photosensitive resin composition of claim 3, further comprising 50 to 97 parts by weight of a solvent in every 100 parts by weight of the composition, wherein the solvent is at least one selected from the group consisting of N,N-dimethylformamide, N,N-dimethylacetamide, N-methylpyrrolidone, N-vinylpyrrolidone, N-methylcaprolactam, dimethylsulfoxide, tetramethyl elements, pyridine, dimethylsulfone, hexamethylsulfoxide, m-cresol, y-butyrolactone, ethylcellosolve, butylcellosolve, ethylcarbitol, butylcarbitol, ethylcarbitol acetate, butylcarbitol acetate, ethyleneglycol, propylene glycol monomethyl ether acetate (PGMEA), lactic acidethyl, lactic acidbutyl, cyclohexanones, and cyclopentanones.

10. An OLED insulating film comprising a polyimide film made by using the positive-type photosensitive resin composition according to claim 9.

11. A semiconductor insulating film comprising a polyimide film made by using the positive-type photosensitive resin composition according to claim 9.

* * * * *